July 23, 1963 H. A. TOULMIN, JR Re. 25,424

CONTINUOUS METAL PRODUCTION AND CONTINUOUS GAS PLATING

Original Filed Sept. 10, 1949

INVENTOR
HARRY A. TOULMIN JR.

Toulmin & Toulmin
ATTORNEYS

United States Patent Office

Re. 25,424
Reissued July 23, 1963

25,424

CONTINUOUS METAL PRODUCTION AND CONTINUOUS GAS PLATING

Harry A. Toulmin, Jr., Dayton, Ohio, assignor, by mesne assignments, to Union Carbide Corporation, New York, N.Y., a corporation of New York Original No. 2,657,457, dated Nov. 3, 1953, Ser. No. 115,033, Sept. 10, 1949. Application for reissue Nov. 1, 1955, Ser. No. 544,387
22 Claims. (Cl. 29—417)

Figure 1:
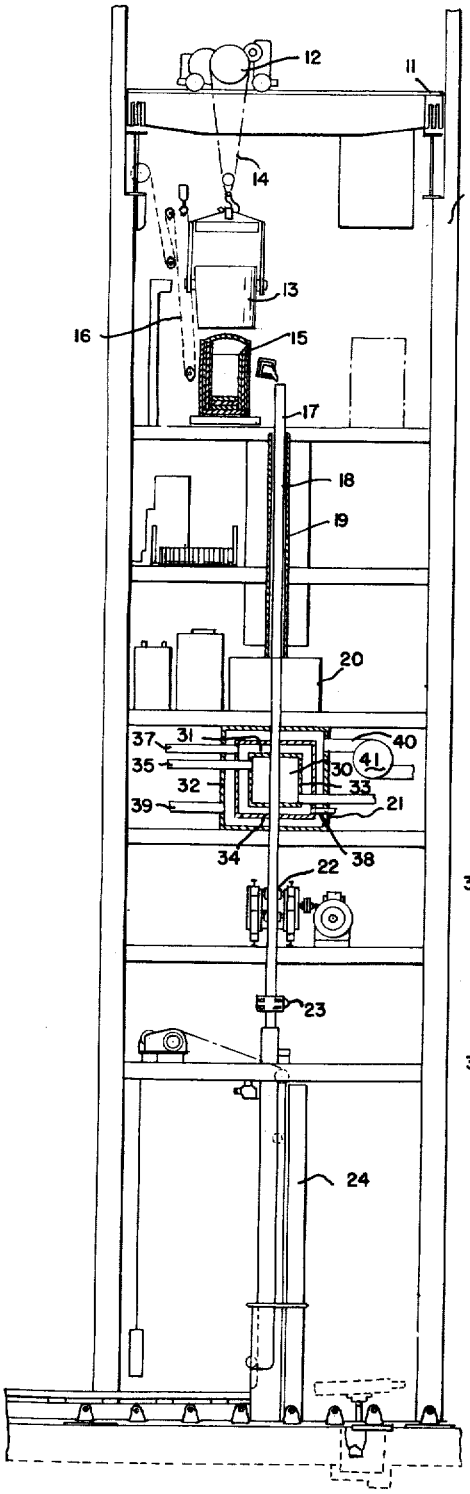

Matter enclosed in heavy brackets [ ] appears in the original patent but forms no part of this reissue specification; matter printed in italics indicates the additions made by reissue.

This invention relates to protective metal coatings. More particularly, it relates to the coating of cast metals by deposition of protective metals through decomposition of volatile metal compounds, and apparatus for carrying out the process.

Special types of carbon and alloy steel and non-ferrous alloys have been manufactured heretofore by pouring the molten metal into ingot molds.

Large size ingots while still hot are removed from the molds and shipped to the soaking pits where they are held until the internal and external ingot temperatures equalize.

The soaked ingots then are rolled in blooming mills into billets preparatory to further processing.

Rough billets require more or less surface conditioning because, for example, the steel is particularly prone to form loose scale and become badly oxidized while cooling, thus necessitating the surface treatment.

This process has now been at least partially superseded by the so-called continuous casting process. Continuous casting has been successfully performed upon a commercial scale, both in conjunction with ferrous and non-ferrous alloys.

While the continuous casting process eliminates several expensive steps, such as making and soaking ingots and rolling them on a blooming mill, it does not, for example, prevent scaling, oxidizing, and other surface conditions.

It is an object of the present invention to overcome the limitations and disadvantages of the processes known heretofore.

It is also an object of the present invention to prepare cast metal objects having a protective coating of a non-oxidizing metal.

It is another object of this invention to prepare cast steel of reduced scaling character.

It is still a further object of this invention to prepare cast steel with ductile protective metal coatings which do not interfere with further processing such as rolling.

It is still another object of this invention to prepare cast metals having protective coatings not depositable by electrolytic methods.

Still another object of the present invention is to produce a simplified method of coating cast steel.

A still further object of this invention is to produce a method wherein continuously cast steel is continuously plated.

It is still another object of this invention to produce a method wherein cast steel is plated while hot and a protective layer deposited.

It is also another object of the present invention to provide a method of increased efficiency due to the utilization of heat normally dissipated in the cooling operation.

Other and more specific objects and advantages will be apparent to one skilled in the art as the following description proceeds.

In brief, the process is carried out by casting metals and when the continuous ribbon of hot but solidified metal issues from the mold, bringing the hot metal into contact with vapors of decomposable metal compounds.

In this way at least a portion of the heat in the molded material instead of being wasted in utilized to decompose volatile metal compounds and deposit a protective coating.

In sequence the molten metal is poured into a shaping mold and cooled to a solid form. The formed cast metal progresses through an insulating sleeve, where cooling is controlled until the cast metal is reduced to a temperature in the range of approximately 300 to 600° F., depending upon the type of metal being cast and the thickness of the casting.

This hot metal then progresses through a plating chamber where the temperature of the metal decomposes vapors of volatile metal compounds continuously fed into contact with the continuously moving cast objects.

The metal at this stage is solidified to the point where its speed of movement may be controlled by a roll drive or equivalent mechanism.

The plated cast metal is then cut to desired length by suitable means such as saws, acetylene torches, and the like.

In the plating step the hot cast metal is brought into contact with continuously changing atmosphere which is made up of gaseous material, at least a portion of which is decomposable at the temperature of the continuously moving cast metal to deposit a metal coating.

Inasmuch as the cast metal is progressing continuously through this chamber, one of the factors important to the successful operation is control of gas pressure not only within the plating chamber itself, but in each of the surrounding annular spaces, of design which will be hereafter explained.

In order to insure against leakage of plating gases which are toxic from the plating chamber and still have openings in the partition walls for the continuous passage of the cast metal, it is necessary to maintain a metal-vapor free gas atmosphere at a slightly higher gas pressure in the annular spaces surrounding the plating chamber.

The leakage of inert gas into a plating chamber is limited to small quantities by having apertures in the partition walls of a configuration providing a loose sliding fit with the object passing therethrough or enlarged holes with shims encircling the moving object in close proximity to these holes and by keeping the pressure differential small.

It will be recognized that the inert gas leaking into the plating chamber is not a harmful operation because the metal bearing gases are usually diluted with an inert gaseous medium and the gas decomposing reaction in the plating chamber produces relatively inert decomposition products.

The stream of gaseous material brought into contact with the hot cast metal may be formed by mixing an inert gas with the vapors of a volatile metal compound or by atomizing a liquid metal compound into a blast of hot inert gas or other equivalent method.

Carbon dioxide, helium, nitrogen, hydrogen, the gaseous product of controlled burning of hydrocarbon gases free of oxygen, and the like, have been utilized as a carrier medium or inert gas medium.

Metals to be deposited may be introduced as gaseous metal carbonyls or vaporized solutions of certain of the metal carbonyls in readily vaporizable solvents (for example, petroleum ether), also nitroxyl compounds, nitrosyl carbonyls, metal hydrides, metal alkyls, metal halides, and the like.

Illustrative compounds of the carbonyl type are nickel, iron, chromium, molybdenum, cobalt, and mixed carbonyls.

Illustrative compounds of other groups are the nitroxyls, such as copper nitroxyl; nitrosyl carbonyls, for example cobalt nitrosyl carbonyl; hydrides, such as antimony hydride, tin hydride; metal alkyls, such as chromyl chloride; and carbonyl halogens, for example, osmium carbonyl bromide, ruthenium carbonyl chloride, and the like.

Each material from which a metal may be plated has a temperature at which decomposition is complete. However, decomposition may take place slowly at a lower temperature or while the vapors are being raised in temperature through some particular range. For example, nickel carbonyl completely decomposes at a temperature in the range of 375° F. to 400° F. However, nickel carbonyl starts to decompose slowly at about 175° F. and therefore decomposition continues during the time of heating from 200° F. to 380° F.

A large number of the metal carbonyls and hydrides may be effectively and efficiently decomposed at a temperature in the range of 350° F. to 450° F. When working with most metal carbonyls we prefer to operate in a temperature range of 375° F. to 425° F.

The process is illustrated without provision for annealing the deposited coating in order to increase their adhesion and ductility. If such an operation is desired provision can be made for an anneal in the inert gas filled annular space, as will be more definitely explained.

Annealing temperatures are higher than plating temperatures and generally in the range of 800° to 1200° F. An anneal may be carried out, for example, by induction heating.

Figure 2:
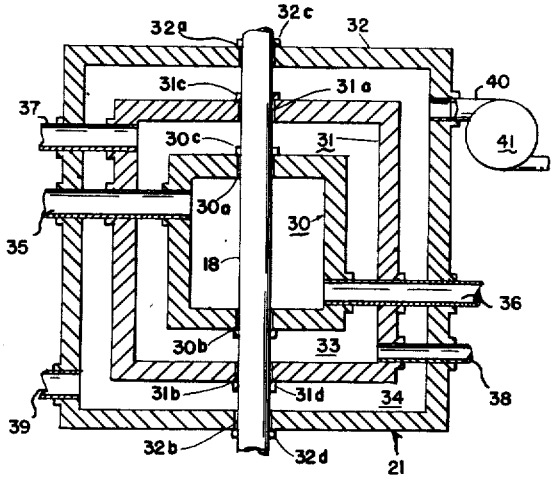

The invention will be more clearly understood from the following description taken in connection with the drawing which:

FIGURE 1 is a diagrammatic elevational view of a complete unit for continuously casting and plating metals; and FIGURE 2 is an enlarged sectional view of the plating equipment.

Referring to the drawings, there is illustrated a continuous method of casting and plating as utilized in connection with steel manufacture without any intention that the invention be limited thereto.

In FIGURE 1 there is shown the supporting framework 10 of a multi-story building. On the top floor of said biulding framework 10 supports tracks 11 for a movable overhead crane 12.

A ladle 13 is suspended from crane 12 by suitable cables 14. Ladle 13 is shown suspended over a heat holding ladle 15. Ladle 15 is actuated for tipping and pouring by suitable means 16 such as pulleys or levers.

Adjacent the ladle 15 is a liquid cooled mold 17 in which ladle 15 is adapted to empty. A cast steel tube 18 is shown issuing from the mold 17 and moving downward through an insulating sleeve 19 within which there is generally maintained an atmosphere of hydrogen.

Steel tube 18 moves downwardly from the sleeve 19 through a unit 20 designed to accurately maintain and control the temperature of the steel tube. Steel tube 18 passes on downward through a plating unit 21 which will be described in more detail.

Plated steel tube is drawn downward at a predetermined rate, generally in the range of 3 to 7 feet per minute for a tube of about 3 inch radius, by squeeze rolls 22.

The coated steel tube is cut into predetermined lengths by an acetylene torch 23 and the tubular units lowered to the horizontal by suitable cradle means 24.

Referring to FIGURE 2, it will be seen that the plating unit 21 consists of an inner wall member 30 and outer well members 31 and 32, which enclose annular spaces or chambers 33 and 34, respectively.

Each of the wall members is provided with two aligned ports indicated as a and b, respectively, of size adapted for close sliding fit with the steel tube 18 passing vertically downward therethrough. The closure of each chamber may be tightened by use of shims indicated as c and d.

The inner chamber is provided with gas inlet and outlet means 35 and 36, respectively. Chamber 33 is provided with gas inlet and outlet means 37 and 38, respectively. Chamber 34 is provided with inlet and outlet means 39 and 40, respectively. Outlet means 40 is adapted with an exhaust means 41, such as a fan, for maintaining less than atmospheric pressure in annular space 34.

Operation of the equipment is as follows:

Hot molten metal is poured at a temperature in excess of 2000° F. In the primary mold the temperature is reduced to that necessary to set the cast metal, for carbon steel this is in a temperature range of 1200° F. to 1600° F.

In the insulating sleeve or "after cooler" the temperature is reduced to a temperature in the range of approximately 300 to 600° F. and preferably to 350 to 450° F. in an atmosphere of hydrogen.

The hot metal then travels through the plating unit. In this unit, the inner chamber is the plating chamber, where the hot metal contacts an atmosphere, preferably of carbon dioxide and vapors of a volatile metal compound. These vapors may be maintained under a variety of pressures, ranging from a pressure below to pressure above atmospheric pressures and generally in the range of 6 inches of water vacuum to 6 inches of water positive pressure.

In the outer annular space there is maintained an atmosphere of inert gas. The gas is maintained under a pressure generally slightly under atmospheric in order that all gas, either that inert introduced or atmospheric air leaking into this annular space 34, will be removed by the exhaust fan and there will be no tendency for gas to leak out, contaminating the atmosphere which must be frequented by workmen.

In the intermediate annular space 33 there is maintained an inert gas atmosphere under pressure generally higher than is maintained in either the inner chamber or the outer annular space. While other arrangements could be used, the high pressure is preferred for the intermediate annular space because gas flow is then inward into the plating chamber through the free space around the traveling rod.

In the plating of nickel, by way of specific example, upon a 3 inch diameter rod of cast steel, the following conditions may be maintained.

The steel may be poured at the rate of approximately 400 pounds per minute, which rate will supply continuously cooled rod traveling at a rate of approximately 5 feet per minute.

The temperature of the rod entering the plating chamber may be controlled to be approximately 425° F.

The rate of flow of gaseous medium to the plating chamber may be approximately 20 cubic feet per hour per cubic foot of chamber space, with nickel carbonyl vapors being present in the ratio of approximately 10 ounces of carbonyl per cubic foot of carbon dioxide gas passed through the plating chamber.

The rate of flow of carbon dioxide gas through the intermediate annular space 33 may be maintained at approximately 30 cubic feet of gas per hour per cubic foot of chamber space.

The rate of flow of gas in the outer annular space 34 may be at the rate of 5 cubic feet per hour per cubic foot of chamber space, and the actual pressure maintained on the space by the exhaust equipment being 2 inches of water vacuum.

It will be understood that while the method and apparatus disclosed and described herein illustrate a preferred form of the invention, modification can be made without departing from the spirit of the invention, and that all modifications that fall within the scope of the appended claims are intended to be included herein.

What is claimed is:

1. A process of casting and plating metal simultaneously and continuously which comprises the steps of pouring molten metal into a mold and continuously withdrawing hot congealed metal from the mold in a downwardly direction, cooling said continuously cast metal to a temperature in the range of 300 to 600° F., thereafter subjecting said cast metal while continuously moving along to a heat-decomposable metal vapor compound, at least a portion of said vapor decomposing at said temperature range whereby metal is deposited on said continuously moving cast metal, and severing the resultant continuously cast and gaseous metal plated product into a desired length.

2. A process of casting and plating ferrous metals simultaneously and continuously comprising the steps of pouring molten ferrous metal into a mold and continuously withdrawing hot congealed metal from the mold in a downwardly direction, cooling said continuously cast metal to a temperature within the range for decomposing a heat-decomposable metal vapor compound, thereafter subjecting said cast metal while continuously moving along to a heat-decomposable metal vapor compound, at least a portion of said vapor decomposing at said temperature range whereby metal is deposited on said continuously moving cast ferrous metal, and severing the resultant continuously cast and gaseous metal plated product into predetermined lengths.

3. A process of casting and plating metal simultaneously and continuously which comprises the steps of pouring molten metal into a mold and continuously withdrawing hot congealed metal from the mold in a downwardly direction, cooling said continuously cast metal to a temperature within the range for decomposing a heat-decomposable metal vapor compound, thereafter subjecting said cast metal while continuously moving along to a heat-decomposable metal vapor compound, at least a portion of said vapor decomposing at said temperature range whereby metal is deposited on said continuously moving cast metal, frictionally controlling the speed of movement of said continuously cast metal, and severing the resultant continuously cast and gaseous metal plated product into predetermined lengths.

4. A process of casting and plating metal simultaneously and continuously which comprises the steps of pouring molten metal into a mold and continuously withdrawing hot congealed metal from the mold in a downwardly direction, cooling said continuously cast metal to a temperature in the range of 350 to 450° F., thereafter subjecting said cast metal while continuously moving along to a heat-decomposable metal vapor compound, at least a portion of said vapor decomposing at said temperature range whereby metal is deposited on said continuously moving cast metal, and severing the resultant continuously cast and gaseous metal plated product into a desired length.

5. A process of casting and plating copper simultaneously and continuously which comprises the steps of pouring molten copper into a mold and continuously withdrawing hot congealed copper from the mold in a downwardly direction, cooling said continuously cast copper to a temperature within the range for decomposing a heat-decomposable metal vapor compound, thereafter subjecting said cast copper while continuously moving along to heat decomposable copper vapors, at least a portion of said vapors decomposing at said temperature range whereby copper metal is deposited on said continuously moving cast copper, and severing said continuously cast and gaseous metal plated copper into predetermined lengths.

6. A process of casting and plating ferrous metals simultaneously and continuously which comprises the steps of pouring molten ferrous metal into a mold and continuously withdrawing hot congealed ferrous metal from the mold in a downwardly direction, cooling said continuously cast ferrous metal to a temperature within the range for decomposing a heat decomposable metal vapor compound, thereafter subjecting said cast ferrous metal to heat-decomposable metal vapors, at least a portion of said vapors decomposing at said temperature range whereby metal is deposited on said continuously moving cast ferrous metal, and severing the resultant continuously cast and gaseous metal plated product into predetermined lengths.

7. A process of casting and plating metal simultaneously and continuously which comprises the steps of pouring molten metal into a mold and continuously withdrawing hot congealed metal from the mold in a downwardly direction, cooling said continuously cast metal to a temperature within the range for decomposing gaseous nickel carbonyl when brought in contact therewith, thereafter subjecting said cast metal while moving along to gaseous nickel carbonyl vapors, at least a portion of said vapors decomposing at said temperature range whereby nickel metal is deposited on said continuously moving cast metal, and severing the resultant continuously cast and gaseous metal plated product into a predetermined length.

8. A process of casting and plating metal simultaneously and continuously which comprises the steps of pouring molten metal into a mold and continuously withdrawing hot congealed metal from the mold in a downwardly direction, cooling said continuously cast metal to a temperature within the range for decomposing gaseous chromium carbonyl when said gaseous carbonyl is brought in contact therewith, thereafter subjecting said cast metal while moving along to a gaseous chromium carbonyl, at least a portion of said carbonyl decomposing at said temperature range whereby chromium metal is deposited on said continuously moving cast metal and severing the resultant continuously cast and gaseous metal plated product into a desired length.

9. A process of casting and plating metal simultaneously and continuously which comprises the steps of pouring molten metal into a mold and continuously withdrawing hot congealed metal from the mold in a downwardly direction, cooling said continuously cast metal to a temperature within the range for decomposing a heat decomposable metal vapor compound, thereafter subjecting said cast metal while moving along and hot to a mixture of gases comprising an inert gas and a heat decomposable metal vapor compound, causing decomposition of said metal vapor compound whereby metal is deposited on said continuously cast metal, and severing the same into predetermined lengths.

10. A process of casting and plating metal simultaneously and continuously which comprises the steps of pouring molten metal into a mold and continuously withdrawing hot congealed metal from the mold in a downwardly direction, cooling said continuously cast metal to a temperature within the range for decomposing a heat-decomposable metal vapor compound, subjecting said cast metal to a temperature within the range for decomposing a heat decomposable metal vapor compound, subjecting said cast metal to a gaseous medium composed of carbon dioxide gas and a heat decomposable metal carbonyl, said metal carbonyl being heat-decomposed whereby metal is deposited on said continuously cast metal upon contacting the hot cast metal, and severing the resultant continuously cast and gaseous metal plated product into a desired length.

11. A process of casting and plating metal simultaneously and continuously which comprises the steps of pouring molten metal into a mold and continuously withdrawing hot congealed metal from the mold in a downwardly direction, cooling said continuously cast metal to a temperature within the range for decomposing a heat decomposable metal vapor compound, subjecting said hot cast metal to a gaseous medium composed of hydrogen and a heat-decomposable gaseous metal hydride causing decomposition of said metal hydride whereby metal is deposited on said continuously cast metal, and severing the same into predetermined lengths.

12. The method of plating continuously cast copper base alloys which comprises: continuously passing molten alloys to a molded form, cooling the molded alloy to a temperature in the decomposing range for volatile metal bearing compounds, thereafter guiding the hot cast material through a chamber where its surface is contacted by a gaseous medium including a heat decomposable metal bearing compound, at least a portion of which is decomposed whereby metal is deposited on the said cast molded metal, and severing the resultant continuously cast and gaseous metal plated product into predetermined lengths.

13. The method of plating continuously cast ferrous metals which comprises: continuously passing cast ferrous molten metal to a molded form, cooling the molded metal to a temperature in the decomposing range for volatile metal bearing compounds, thereafter guiding the hot metal through a chamber where its surface is contacted by a gaseous medium including a heat decomposable metal bearing compound, at least a portion of which is a gaseous chromium carbonyl which decomposes whereby chromium metal is deposited on the said cast molded metal, and severing the resultant continuously cast and gaseous metal plated product into predetermined lengths.

14. The method of plating continuously cast metals which comprises: continuously passing cast molten metal to a molded form, cooling the molded metal to a temperature in the decomposing range for volatile metal bearing compounds, thereafter guiding the hot cast material through a chamber sealed against escape of toxic gases by maintaining an atmosphere of hydrogen in the annular spaces surrounding the plating chamber, contacting the hot metal within said chamber with a gaseous medium composed of hydrogen and heat decomposable metal hydrides causing decomposition of said metal hydrides whereby metal is deposited on said continuously cast metal, and severing the same into predetermined lengths.

*15. A continuous method for producing an inorganic elongated ribbon or elongated element of refractory material in a hot solidified state as produced and coating with another, diverse inorganic material by passing the hot elongated element through a thermally decomposable gas bearing the second inorganic material, capable of depositing its material content on the first inorganic element.*

*16. A continuous method for producing a coated refractory strand or ribbon of solidified, hot material comprising the steps of drawing a continuous, moving, substantially pure strand from the molten refractory material, and applying at least one coating of an inorganic substance which is deposited on said moving strand by thermal decomposition of a gaseous metal compound.*

*17. A method of producing a coated refractory strand of material as set forth in claim 16, wherein said inorganic coated substance is a metal.*

*18. A method of producing a coated refractory strand of material as set forth in claim 16, wherein said inorganic substance is a metallic oxide.*

*19. A continuous method of producing an inorganic elongated strand or ribbon in a hot solidified state, com-*

*prising the steps of applying at least one coating of an inorganic substance which is deposited by thermal decomposition of a gaseous metal compound onto a continuously moving refractory elongated element as it emerges from a refractory heating furnace.*

*20. A method of producing a continuous refractory elongated strand or ribbon comprising the steps of subjecting a hot elongated inorganic ribbon or elongated element to gaseous metal plating as said elongated element emerges from a refractory heating furnace, said gaseous metal plating being adapted to deposit a metal coating on said elongated refractory element as the same is continuously moved from said refractory furnace.*

*21. A continuous method for producing a coated elongated ribbon of refractory material comprising the steps of continuously moving a solidified ribbon of material from a molten bath of a refractory material, and then applying thereto one or more coatings of an inorganic substance to said moving ribbon, at least one of said coatings being a metal by moving said solidified ribbon of material through a metal deposition chamber, which chamber is filled with a thermally decomposable gaseous metal bearing compound and which decomposes to deposit the metal onto said elongated ribbon of refractory material.*

*22. A continuous method for producing a coated elongated ribbon of refractory material comprising the steps of continuously moving a solidified ribbon of material from a refractory heating furnace, and then applying thereto at least one coating of an inorganic substance to said moving ribbon by moving said solidified ribbon of material through a metal deposition chamber, which chamber is filled with a thermally decomposable gaseous metal bearing compound and which decomposes to deposit the metal onto said elongated ribbon of refractory material.*

References Cited in the file of this patent or the original patent

UNITED STATES PATENTS

| | | |
|---|---|---|
| 1,156,169 | Monnot | Oct. 12, 1915 |
| 1,956,467 | Palm | Apr. 24, 1934 |
| 2,073,334 | Coffman | Mar. 9, 1937 |
| 2,118,701 | Field | May 24, 1938 |
| 2,219,004 | Daeves et al. | Oct. 22, 1940 |
| 2,290,083 | Webster | July 14, 1942 |
| 2,332,309 | Drummond | Oct. 19, 1943 |
| 2,344,138 | Drummond | Mar. 14, 1944 |
| 2,363,695 | Ruppik | Nov. 28, 1944 |
| 2,382,432 | McManus et al. | Aug. 14, 1945 |
| 2,442,485 | Cook | June 1, 1948 |
| 2,590,311 | Harter | Mar. 25, 1952 |
| 2,653,879 | Fink | Sept. 29, 1953 |
| 2,656,284 | Toulmin | Oct. 20, 1953 |
| 2,699,415 | Nachtman | Jan. 11, 1955 |

OTHER REFERENCES

PB 83878, see Frames 7245 to 7255 inclusive, Bibliography of Scientific and Industrial Reports, Office of Technical Services, U.S. Department of Commerce, vol. 9, No. 11, June 11, 1948.

Iron Age, vol. 162, No. 8, August 19, 1948, pp. 76 and 77.